United States Patent [19]
Honda

[11] Patent Number: 5,767,515
[45] Date of Patent: Jun. 16, 1998

[54] RULE BASED CONTROL FOR CHARGED-PARTICLE BEAM INSTRUMENT

[75] Inventor: Kazuhiro Honda, Tokyo, Japan

[73] Assignee: JEOL Ltd., Tokyo, Japan

[21] Appl. No.: 791,092

[22] Filed: Jan. 29, 1997

[30] Foreign Application Priority Data

Jan. 29, 1996 [JP] Japan .................... 8-012663

[51] Int. Cl.$^6$ .................................. H01J 37/28
[52] U.S. Cl. .................................. 250/310
[58] Field of Search ............... 250/310, 306, 250/307, 346 R, 346 ML

[56] References Cited

U.S. PATENT DOCUMENTS 5,404,012   4/1995   Yamada .................................. 250/310

OTHER PUBLICATIONS

"A Fully Computer-Controlled Scanning Electron Microscope", Hiromu Fujioka et al., *J. Electron Microsc.*, vol. 35 No. 3, pp. 215–219, Oct. 13, 1986.

"Knowledge–Based Sewerage Pump Control System With Fuzzy Inference", Kazuhiro Honda et al. has no date and page number.

"Development of a High Resolution Semi–in–Lens Digital Field Emission Scanning Electron Microscope: JSM–6430F", Youiti Yamamoto et al., *JEOL News*, vol. 32 E, No. 1, pp. 39–41 (1996)

*Primary Examiner*—Kiet T. Nguyen
*Attorney, Agent, or Firm*—Webb Ziesenheim Bruening Logsdon Orkin & Hanson, P.C.

[57] ABSTRACT

Rule-based control for charged-particle beam instrument, typified by a scanning electron microscope, capable of accurately controlling the excitation of plural lenses with a small amount of data. The instrument is equipped with a computer which is programmed with a fuzzy reasoning software inference engine, a pretreatment routine, a posttreatment routine, a rule base in which rules are stored, and a rule editor capable of editing the rules in the rule base. The fuzzy reasoning inference engine infers, by fuzzy reasoning, amounts (numerical values) which control the excitation of the lenses. The pretreatment routine normalizes parameters and enters the normalized variables into the inference engine. The posttreatment routine denormalizes output variables from the fuzzy reasoning inference engine.

4 Claims, 8 Drawing Sheets

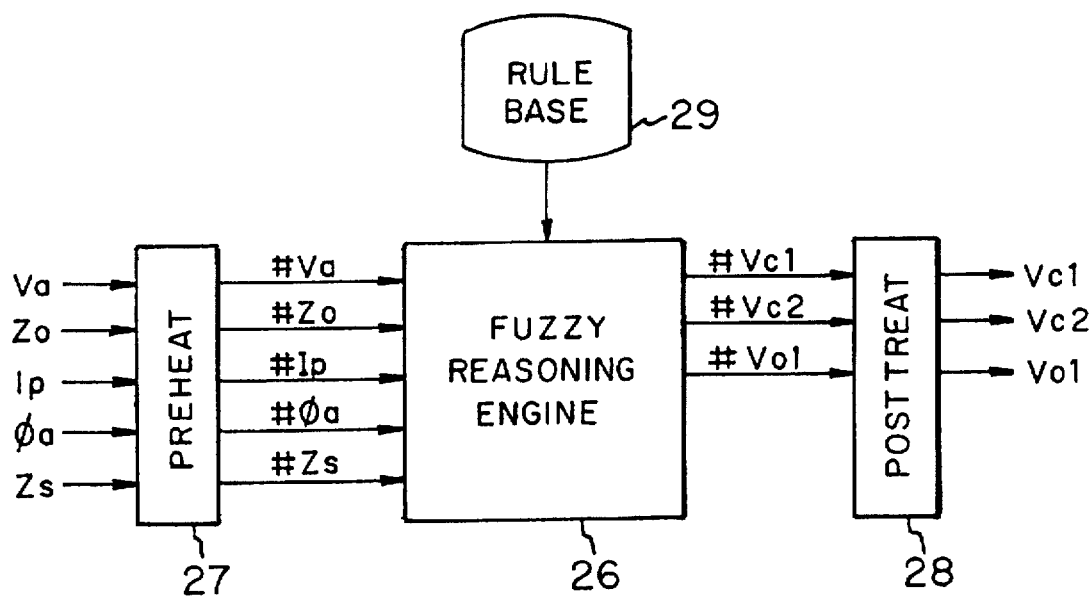
FIG. 5
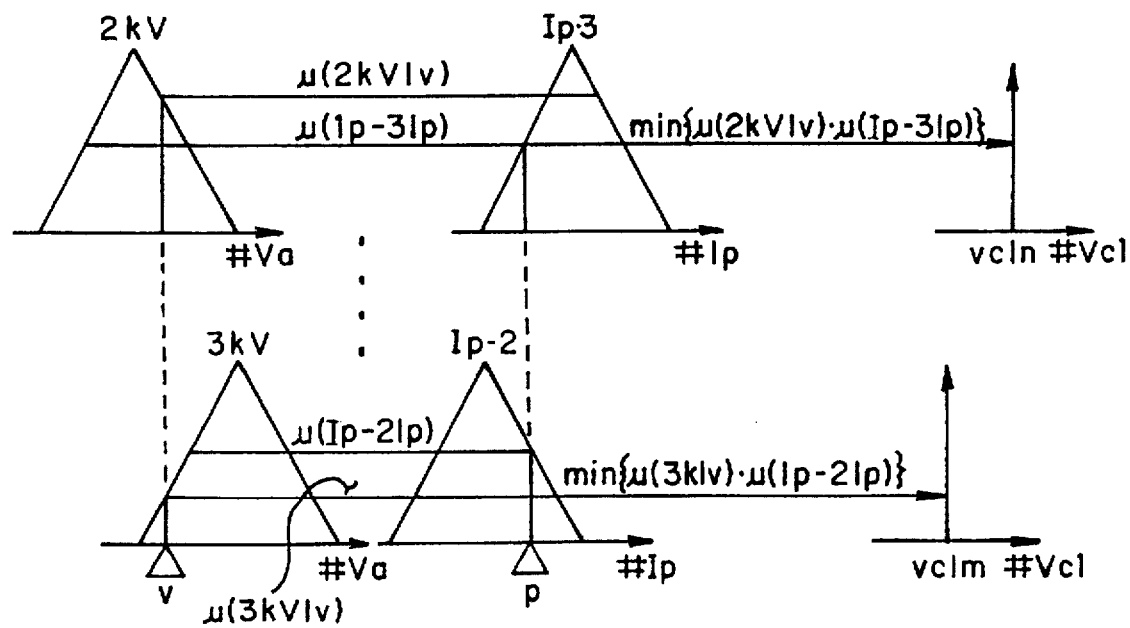
FIG. 7(a)
FIG. 7(b)

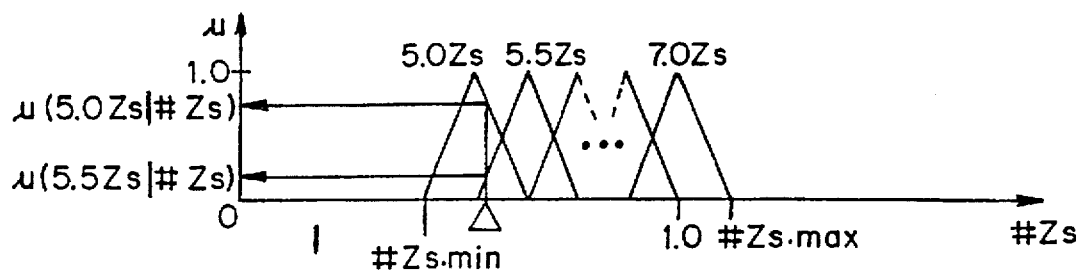
FIG. 6(e)
FIG. 8(a)
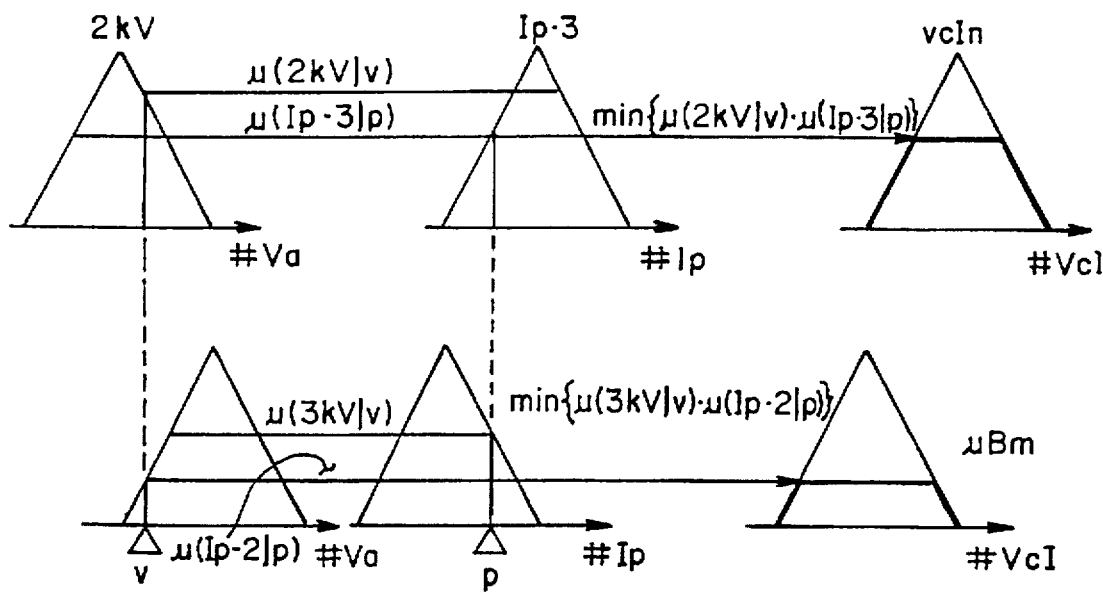
FIG. 8(b)
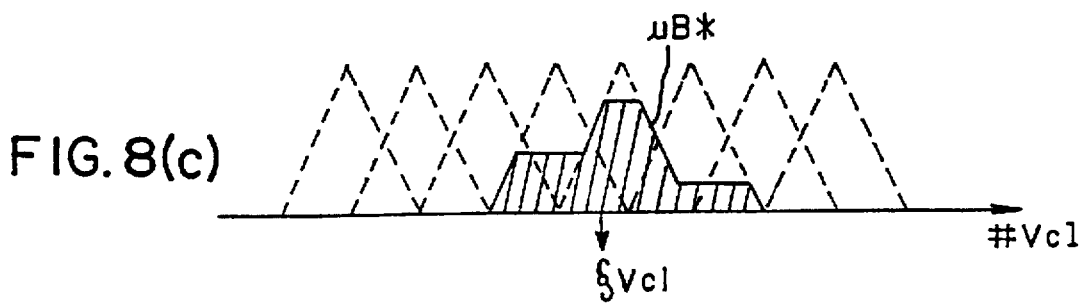
FIG. 8(c)

RULE BASED CONTROL FOR CHARGED-PARTICLE BEAM INSTRUMENT

FIELD OF THE INVENTION

The present invention relates to a charged-particle beam instrument, such as a scanning electron microscope, having a plurality of lenses which can be controlled accurately. Also, the invention relates to a method of accurately controlling these lenses incorporated in the charged-particle beam instrument.

BACKGROUND OF THE INVENTION

In an electron beam instrument such as a scanning electron microscope or electron beam lithography system, an electron beam is focused onto a specimen by means of a plurality of lenses. The excitation of each lens is determined by the voltage applied across the lens if it is of the electrostatic type. If it is of the electromagnetic type, the strength is determined by the amount of current supplied to the lens coil. That is, this voltage or current is an amount providing control of the excitation of the lens. In an electron beam instrument such as a scanning electron microscope, the values of plural kinds of amounts providing control of the lens excitation are set in small increments according to values of the accelerating voltage and beam current.

Referring to FIG. 1, there is shown a scanning electron microscope. This microscope has an electron gun 1 emitting an electron beam EB which is sharply focused onto a specimen 5 by a first condenser lens 2, a second condenser lens 3, and an objective lens (final stage of condenser lens) 4. The electron beam EB is made to scan the surface of the specimen 5 by a deflector (not shown).

As a result of this scanning, secondary electrons e are produced from the specimen 5. These electrons are detected by a secondary electron detector 6. The output signal from the detector 6 is supplied to a cathode-ray tube (CRT) 8 synchronized with this scanning via an image signal-processing unit 7 including an amplifier, a contrast-adjusting circuit, and a brightness-adjusting circuit. An aperture 9 limits the dose of the primary electron beam EB impinging on the specimen 5, and is located between the second condenser lens 3 and the objective lens 4. The dose of the electron beam hitting the specimen 5, i.e., the beam current at the specimen, is determined by the size of the aperture 9 and the excitation of the first and second condenser lenses 2, 3. A Faraday cup 10 is positioned under the aperture 9 so that the cup can be moved into and out of the electron beam path.

An accelerating voltage controller 11 generates an accelerating voltage for accelerating the primary electron beam EB emitted from the electron gun 1. A first condenser lens controller 12 produces a lens excitation-controlling amount that provides control of the excitation of the first condenser lens 2. A second condenser lens controller 13 produces a lens excitation-controlling amount which provides control of the excitation of the second condenser lens. An objective lens controller 14 produces a lens excitation-controlling amount which controls the excitation of the objective lens 4. These operations of these controllers 11–14 are under control of a computer 15, which is equipped with a lens data-setting means 16 for determining the lens excitation-controlling amounts that provide control of the lens strengths. Also, the computer 15 incorporates a lens data table 17 in which lens excitation-controlling amounts are stored. The lens data-setting means 16 determines lens excitation-controlling amounts by referring to the lens data table 17. The determined amounts are sent via a man-machine interface 18 to all of the first condenser lens controller 12, second condenser lens controller 13, and objective lens controller 14.

A controlling CRT 19 permits the operator to set desired parameters such as accelerating voltage-controlling value and probe current reaching the specimen. When the set parameters are sent from the controlling CRT 19 to the lens data-setting means 16, all the lens excitation-controlling amounts are determined in association with each other. A current-measuring device 20 measures the dose of the electron beam detected by the Faraday cup 10. The output from the current-measuring device 20 is fed to the computer 15. The instrument constructed as described thus far operates in the manner described below.

When a secondary electron image is to be observed, the computer 15 controls an electron beam deflection circuit (not shown), so that the deflection circuit supplies a desired two-dimensional scanning signal to the deflector and to the CRT 8 in synchronism. As a result, a desired two-dimensional region on the specimen 5 is raster-scanned by the electron beam EB, thus producing secondary electrons from the specimen. These electrons are detected by the detector 6. Since the output signal from this detector 6 is supplied to the CRT 8 via the image signal-processing unit 7, a secondary electron image of the desired region is displayed on the CRT 8.

The above-described lenses are controlled in the manner described below. The various parameters including desired accelerating voltage and probe current are entered into the controlling CRT 19. The values of these parameters are supplied to the lens data-setting means 16 via the man-machine interface 18. In response to the incoming parameter values, the lens data-setting means 16 reads various lens excitation-controlling amounts from the lens data table 17. Then, the amounts read out in this way are sent to the controllers 12–14 for the lenses, respectively, via the man-machine interface 18. In consequence, the excitation of the lenses 2, 3, and 4 are adjusted to values corresponding to the given accelerating voltage and probe current value.

If a different lens excitation-controlling amount is entered through the controlling CRT 19 to control the accelerating voltage, a signal indicating this amount is supplied to the accelerating voltage controller 11 via the man-machine interface 18. As a result, the voltage for accelerating the primary electron beam EB from the electron gun 1 changes. When the operator checks whether the dose of the electron beam impinging on the specimen has reached the desired value, the Faraday cup 10 is inserted in the electron beam path. The current-measuring device 20 measures the beam current picked up by the Faraday cup 10. The measured value is supplied to the lens data-setting means 16 via the man-machine interface 18. The measured current value is displayed on the controlling CRT 19. If this displayed value is different from the setting, the operator modifies the lens excitation-controlling amounts via the controlling CRT 19, so that the measured current value reaches the desired value.

In a scanning electron microscope, the lens excitation-controlling amounts are determined by numerous parameters which vary according to the conditions. These parameters are accelerating voltage, probe current (i.e., current reaching the specimen), objective lens aperture diameter, and virtual electron source position. In a scanning electron microscope, the trajectory of the primary electron beam EB is controlled by the plural electron lenses whose excitations determined as described above. That is, the scanning electron microscope adopts a multivariable control system which is composed of the plural electron lenses.

Furthermore, in a scanning electron microscope, the final output is expressed in terms of a SEM image rather than numerical values. Therefore, no feedback signal is obtained. Consequently, in a scanning electron microscope, the lens excitation is controlled by open loop. In particular, in a scanning electron microscope, the lens excitation-controlling amounts are organized in the lens data table 17 for each set of observation conditions, such as accelerating voltage, probe current, objective lens aperture diameter, and virtual electron source position. The lens data-setting means 16 selects lens excitation-controlling amounts adapted for the observation conditions from the lens data table 17. Data about the lens excitation-controlling amounts stored in the lens data table 17 have been calculated based on electron optics from a number of observational conditions, or lens parameters, and take discrete values. In order to improve the control accuracy, closer discrete values must be calculated. However, this will make the amount of calculation and the amount of data stored in the lens data table 17 exorbitantly large.

On the other hand, objective lens aperture diameter, and probe current are determined by the angular current density or brightness of the electron gun 1. However, it is difficult to accurately measure the angular current density and brightness. Therefore, actual lens excitation-controlling amounts deviate slightly from the calculated amounts. To compensate for this, the excitation of all the lenses must be corrected, because the scanning electron microscope adopts a multivariable control system and thus it is impossible to vary only one lens excitation.

FIG. 2 shows a three-dimensional parametric space for determining a lens excitation-controlling amount Vc1 providing control of the excitation of the first condenser lens 2. This amount Vc1 is stored in the lens data table 17, and is a function of accelerating voltage Va, virtual electron source position Zo, probe current Ip, and diameter $\phi a$ of the objective lens aperture 9. We assume for convenience that the diameter $\phi a$ of the objective lens aperture 9 is given. Then, we have $$Vc1=Vc1(Va, Zo, Ip)$$

As shown in FIG. 2, the three-dimensional parametric space consists of sets of first condenser lens control tables 22 where values of Vc1 exist at intersections of the discrete values of Va, Zo, and Ip. The virtual electron source position Zo is a function of voltage Vex for extracting electrons from the electron gun 1, and gives a relationship Zo=Zo (Vex). Accordingly, if the extraction voltage Vex is determined, then the virtual electron source position Zo is determined. If so, the amount Vc1 is determined by the accelerating voltage Va and probe current Ip.

As a result, the control range for the first condenser lens 2 is given by lattice points on a two-dimensional first condenser control table 21. However, if the extraction voltage Vex is varied, the angular current density of the primary electron beam EB from the electron gun 1 changes. This varies the probe current Ip impinging on the specimen 5. For this reason, it is impossible to determine the amount Vc1 simply from the probe current Ip and accelerating voltage Va.

Referring next to FIG. 3, a three-dimensional parametric space for determining a lens excitation-controlling amount Vc2 providing control of the excitation of the second condenser lens 3 is similar in configuration to the space shown in FIG. 2. These amounts Vc1 and Vc2 are not independent values; rather they must be determined in combination.

In practice, the lens excitation-controlling amounts must be determined not independently but in combination. For each of the lens excitation-controlling amounts, the accelerating voltage Va, probe current Ip, diameter $\phi a$ of the objective lens aperture, and virtual excitation source position Zo must be quantized, and the resulting discrete values must be combined. Therefore, each amount is made exorbitantly large. It is assumed that the accelerating voltage Va is quantized into n values, probe current Ip is quantized into m values, objective lens aperture diameter $\phi a$ is quantized into q values, and virtual electron source position Zo is quantized into r values. The amount providing control of each lens excitation is quantized into $n \times m \times q \times r$ values. We now assume that the accelerating voltage is varied in 50 increments (n=50), the probe current is varied in 10 increments (m=10), the objective lens aperture diameter is varied in 5 increments (q=5), and the virtual electron source position is varied in 10 increments (r=10). The number of discrete increments representing the amount providing control of each lens excitation amounts to as many as 25,000. This makes it substantially impossible to handle the data. That is, even if only a part of actually obtained data deviates from the corresponding part of the data obtained by calculations, every data item about control of the lens excitation must be recalculated based electron optics. This has taken a long time. Furthermore, the data stored in the data tables consists of arrays of numerical values and so the physical meaning of each numerical value cannot be understood.

SUMMARY OF THE INVENTION

It is an object of the present invention to provide a method of accurately controlling the excitation of lenses in a charged-particle beam instrument with a small amount of data.

It is another object of the invention to provide a charged-particle beam instrument having lenses whose excitation can be controlled accurately with a small amount of data.

A method of controlling the excitation of lenses in a charged-particle beam instrument in accordance with the present invention has a charged-particle beam source for producing a charged-particle beam and a plurality of lenses. This method is characterized in that lens excitation-controlling amounts providing control of the excitation of the lenses are determined by fuzzy reasoning.

A charged-particle beam instrument according to the present invention has a charged-particle beam source for producing a charged-particle beam and a plurality of lenses. The instrument has a rule base and a fuzzy reasoning means. Various lens parameter values for determining the lens excitation-controlling amounts and these controlling amounts are described in terms of if . . . then construction, thus creating rules. These rules are stored in the rule base. The fuzzy reasoning means determines the lens excitation-controlling amounts from the various lens parameter values by referring to the rules by fuzzy reasoning.

Another charged-particle beam instrument according to the invention has a charged-particle beam source for producing a charged-particle beam and a plurality of lenses and further includes a first rule base, a first fuzzy reasoning means, a second rule base, and a second fuzzy reasoning means. Various lens parameter values for determining the lens excitation-controlling amounts which control lens excitation are provided by rules and described in terms of if . . . then construction. These rules are stored in the first rule base. The first fuzzy reasoning means determines lens parameter-correcting values by fuzzy reasoning from entered various lens parameter values by referring to the first rule base. The rules describing various lens parameter values and lens excitation-controlling amounts in terms of if . . . then construction are stored in the second rule base. The second fuzzy reasoning means determines lens excitation-controlling amounts by fuzzy reasoning from entered various corrected lens parameter values by referring to the second rule base.

In another feature of the invention, the above-described instrument further includes a rule editor capable of modifying and erasing the rules stored in the rule bases and of adding new rules to the rule bases.

Other objects and features of the invention will appear in the course of the description thereof, which follows.

BRIEF DESCRIPTION OF THE DRAWINGS

FIG. 5 is a diagram illustrating the manner in which data is transferred into and out of a computer incorporated in the scanning electron microscope shown in FIG. 4;

FIGS. 6(a) to 6(E) are diagrams illustrating examples of division of an input variable space into fuzzy sets;

FIGS. 7(a) and (b) are diagrams illustrating fuzzy reasoning in which output variables from the THEN part of each rule are expressed in terms of numerical values;

FIGS. 8(a), (b) and (c) are diagrams illustrating fuzzy reasoning in which output variables from the THEN part of each rule are expressed in terms of fuzzy sets, the rule being used in the scanning electron microscope shown in FIG. 4;

DETAILED DESCRIPTION OF THE INVENTION

Figure 1:
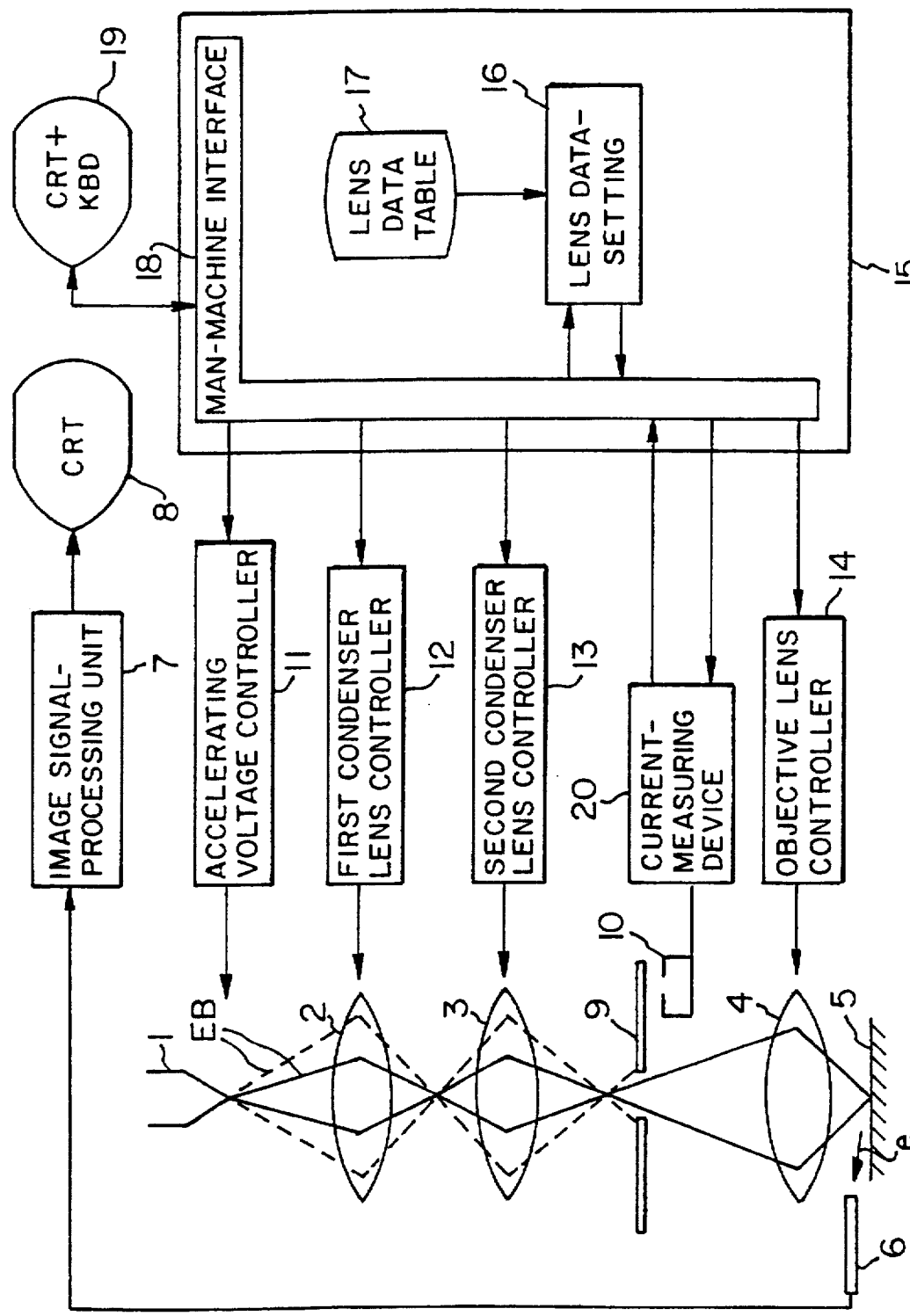
FIG. 1 is a diagram of the prior art scanning electron microscope.
Figure 2:
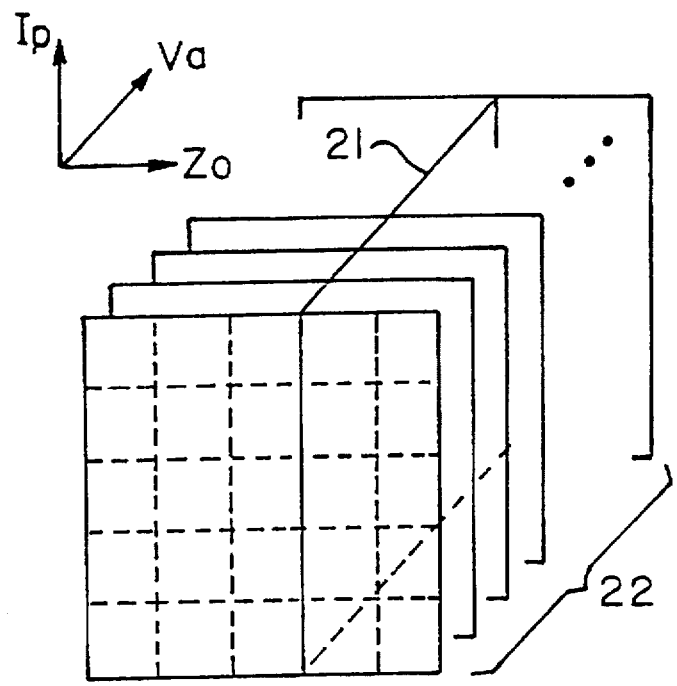
FIG. 2 is a diagram illustrating a three-dimensional parametric space used to determine lens excitation-controlling amounts providing control of the excitation of a first condenser lens incorporated in a scanning electron microscope in accordance with the prior art.
Figure 3:
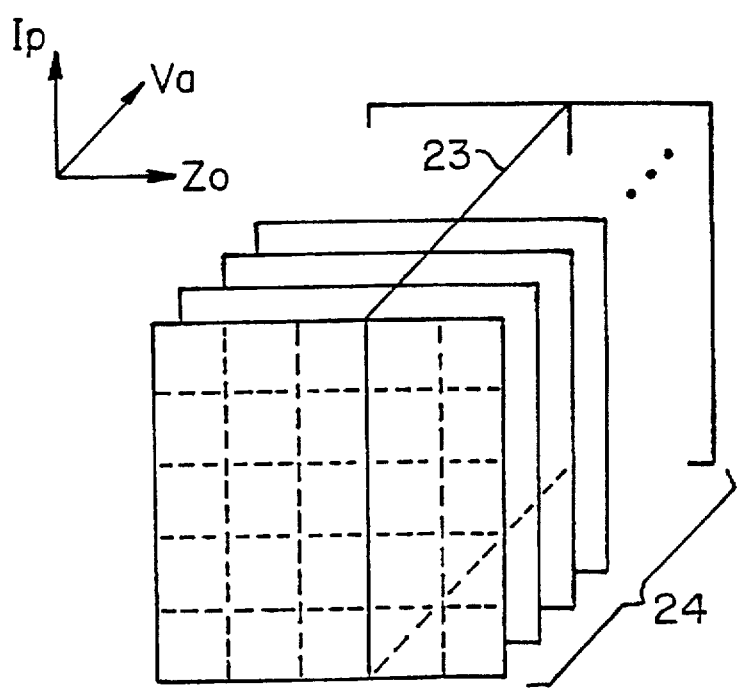
FIG. 3 is a diagram similar to FIG. 2, but in which lens excitation-controlling amounts providing control of the excitation of a second condenser lens are determined.
Figure 4:
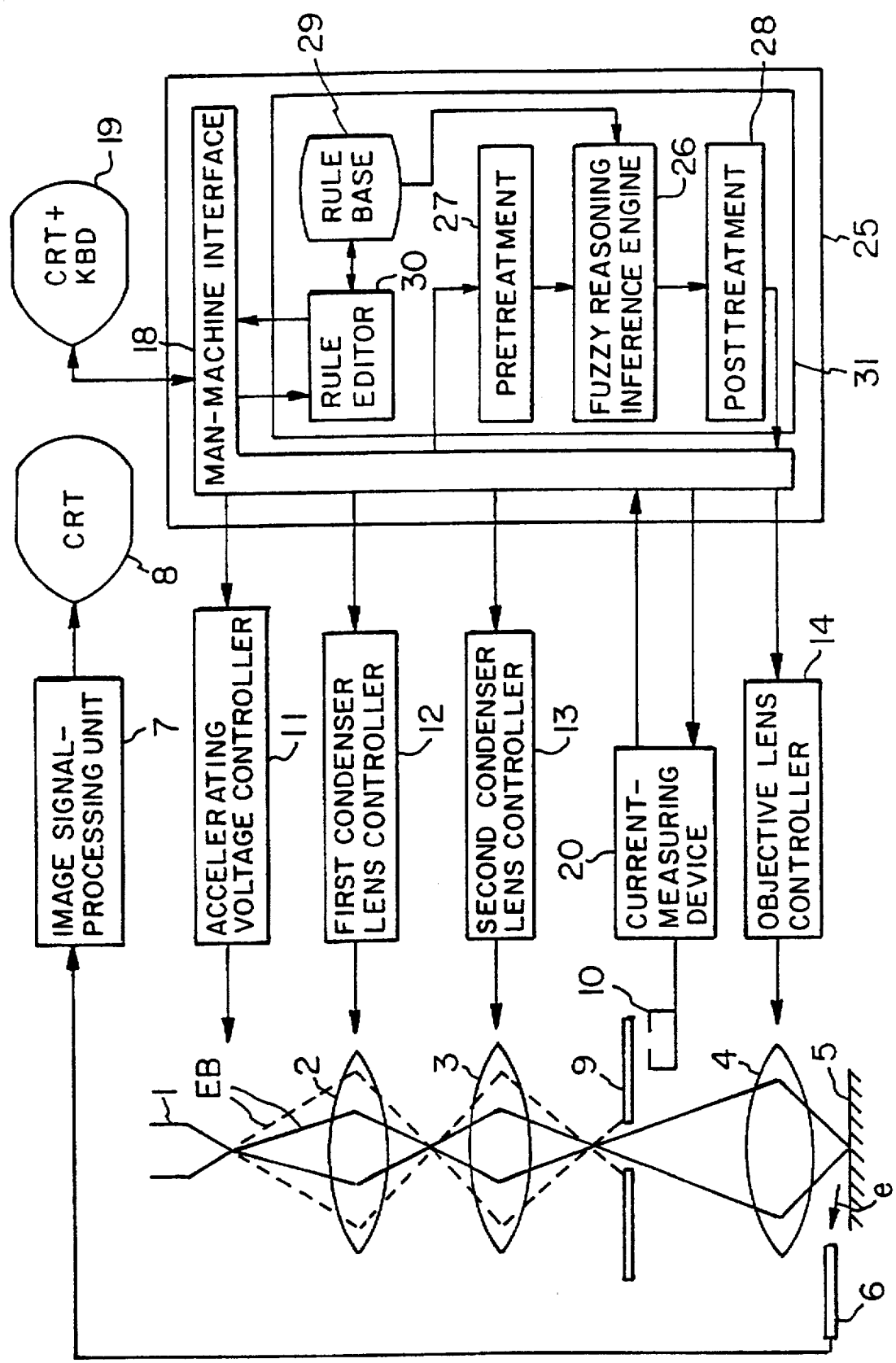
FIG. 4 is a diagram showing a scanning electron microscope according to the invention.

Referring to FIG. 4, there is shown a scanning electron microscope embodying the concept of the present invention. It is to be noted that like components are indicated by like reference numerals in various figures and that those components which have been already described will not be described in detail below.

This instrument has a computer 25 which sets the accelerating voltage controller 11 at a desired accelerating voltage-controlling value. The computer 25 sets the first condenser lens controller 12, the second condenser lens controller 13, and the objective lens controller 14 at desired lens excitation-controlling amounts, respectively.

The computer 25 includes a fuzzy reasoning means 26, a pretreatment means 27, a posttreatment means 28, a rule base 29, and a rule editor 30. The fuzzy reasoning means 26 determines each controlling amount by fuzzy reasoning. The pretreatment means 27 normalizes various parameters and enters them into the fuzzy reasoning means 26. The posttreatment means 28 denormalizes the output from the fuzzy reasoning means 26. The rule base 29 stores rules which describe various lens parameters and controlling amounts in terms of if . . . then construction, the parameters being used to determine the controlling amounts. The rule editor 30 edits the rule stored in the rule base 29. The fuzzy reasoning means 26, pretreatment means 27, posttreatment means 28, rule base 29, and rule editor 30 together constitute a lens controller 31.

FIG. 5 illustrates the manner in which data is transferred into and out of the computer 25. The human operator enters the accelerating voltage Va, virtual electron source position Zo, probe current Ip, objective lens aperture diameter $\phi a$, and specimen position Zs into the pretreatment means 27 through the controlling CRT 19. The pretreatment means 27 normalizes these entered values and delivers normalized accelerating voltage #Va, normalized virtual electron source position #Zo, normalized probe current #Ip, normalized objective lens aperture diameter #$\phi a$, and normalized specimen position #Zs to the fuzzy reasoning means 26.

The fuzzy reasoning means 26 determines a first condenser lens excitation-controlling amount #Vc1, a second condenser lens excitation-controlling amount #Vc2, and an objective lens excitation-controlling amount #Vo1 from these normalized values #Va, #Zo, #Ip, #$\phi a$, and #Zs by fuzzy reasoning by referring to the rules stored in the rule base 29. The determined values are sent to the posttreatment means 28.

The posttreatment means 28 denormalizes the normalized values #Vc1, #Vc2, and #Vo1 and supplies a denormalized first condenser lens excitation-controlling amount Vc1, a denormalized second condenser lens excitation-controlling amount Vc2, and a denormalized objective lens excitation-controlling amount Vo1 to the first condenser lens controller 12, second condenser lens controller 13, and objective lens controller 14, respectively.

The operation of the embodiment described above is next described in further detail. As mentioned previously, the pretreatment means 27 normalizes the entered accelerating voltage value Va, virtual electron source position Zo, probe current value Ip, objective lens aperture diameter $\phi a$, and specimen position Zs and sends the normalized values #Va, #Zo, #Ip, #$\phi a$, #Zs to the fuzzy reasoning means 26. These normalized values are given by

Va=Va/Va-norm

Zo=Zo/Zo-norm

Ip=Ip/Ip-norm

$\phi a$=$\phi a$/$\phi a$-norm

Zs=Zs/Zs-norm where Va-norm is an accelerating voltage-normalizing coefficient, Zo-norm is a virtual electron source position-normalizing coefficient, Ip-norm is a probe current-normalizing coefficient, $\phi a$-norm is an objective lens aperture diameter-normalizing coefficient, and Zs-norm is a specimen position-normalizing coefficient. Each variable space of the {#Va, #Zo, #Ip, #$\phi a$, #Zs} is divided into a plurality of fuzzy sets. Examples of this are shown in FIG. 6.

Figure 6A:
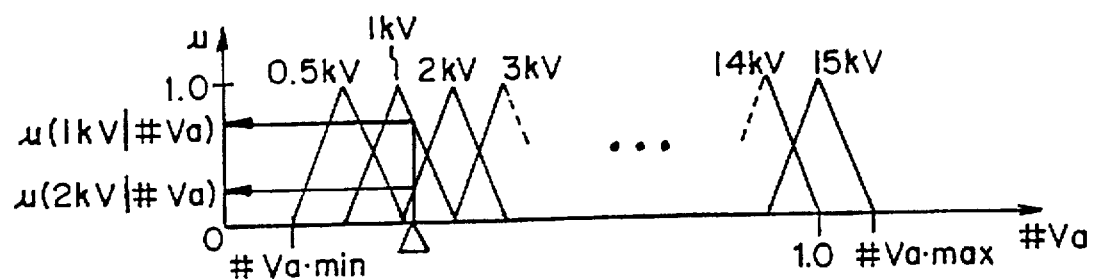
Figure 6B:
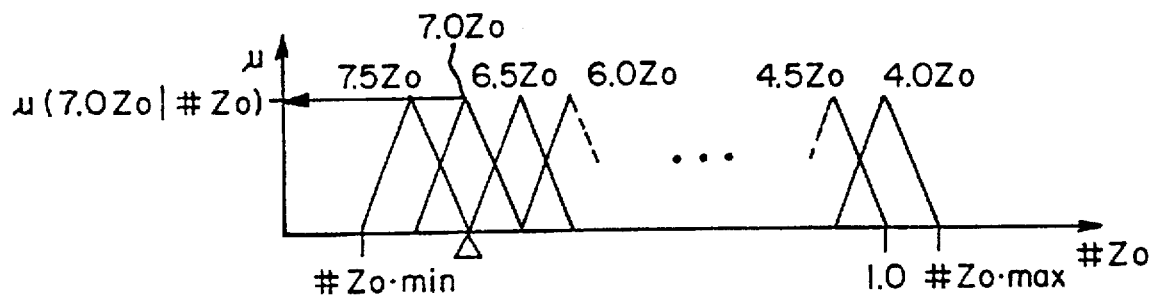

FIG. 6(a) shows an example of division of #Va. A region of #Va having a minimum value of #Va·min and a maximum value of #Va·max is divided into 16 fuzzy sets {0.5 kV, 1 kV, 2 kV, 3 kV, 4 kV, 5 kV, 6 kV, 7 kV, 8 kV, 9 kV, 10 kV, 11 kV, 12 kV, 13 kV, 14 kV, 15 kV}. As shown in FIG. 6(b), a region of #Zo having a minimum value of #Zo ·min and a maximum value of #Zo ·max is divided into 8 fuzzy sets {7.5 Zo, 7.0 Zo, 6.5 Zo, 6.0 Zo, 5.5 Zo, 5.0 Zo, 4.5 Zo, 4.0 Zo}.

Figure 6C:
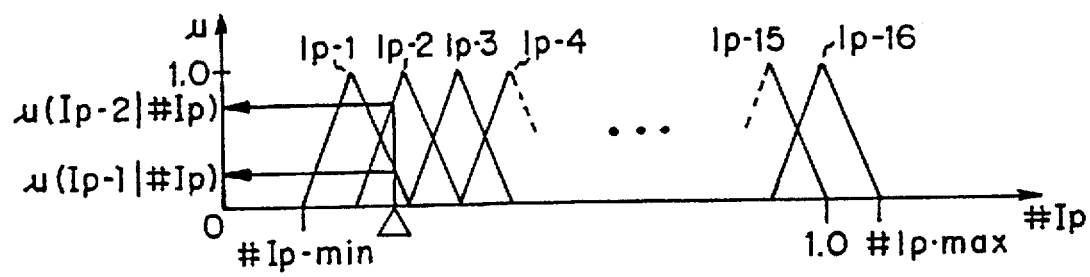
Figure 6D:
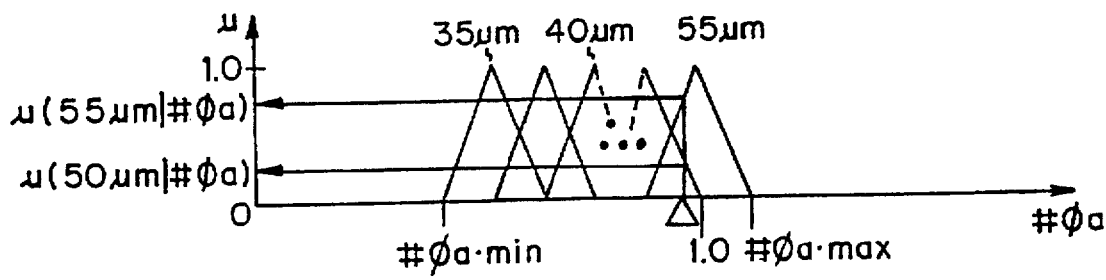

Referring next to FIG. 6(c), a region of #Ip having a minimum value of #Ip·min and a maximum value of #Ip·max is divided into 16 fuzzy sets {Ip·1, Ip·2, Ip·3, Ip·4, Ip·5, Ip·6, Ip·7, Ip·8, Ip·9, Ip·10, Ip·11, Ip·12, Ip·13, Ip·14, Ip·15, Ip·16}. As shown in FIG. 6(d), a region of #φa having a minimum value of #φa·min and a maximum value of #φa·max is divided into 5 fuzzy sets {35 μm, 40 μm, 45 μm, 50 μm, 55 μm}. As shown in FIG. 6(e), a region of #Zs having a minimum value of #Zs·min and a maximum value of #Zs·max is divided into 5 fuzzy sets {5.0 Zs, 5.5 Zs, 6.0 Zs, 6.5 Zs, 7.0 Zs}.

These examples of division are characterized in that the fuzzy sets overlap with each other. The fuzzy sets shown in FIG. 6 is represented in terms of membership functions indicating degrees (membership values) to which elements belong to their respective fuzzy sets. Specifically, in FIG. 6(a), when some triangularly imprinted portion #Va is applied, μ (1 kV|#Va), μ (2 kV|#Va) are its membership values indicating the degrees to which the elements belong to the fuzzy set {1 kV} and fuzzy set {2 kV}, respectively.

Similarly, in FIG. 6(b), μ (7.0 Zo|#Zo) is a membership value indicating the degree to which elements belong to some fuzzy set {7.0 Zo}. In FIG. 6(c), μ (Ip·1|#Ip) and μ (Ip·2|#Ip) are membership values indicating the degrees to which elements belong to some fuzzy sets {#Ip·1} and {(#Ip·2}, respectively. In FIG. 6(d), μ (50 μm|#φa) and μ (55 μm|#φa) are membership values indicating the degrees to which the elements belong to some fuzzy sets {50 μm} and {55 μm}, respectively, of #φa. In FIG. 6(e), μ (5.0 Zs|#Zs) and μ (5.5 Zs|#Zs) are membership values indicating the degrees to which elements belong to some fuzzy sets {5.0 Zs} and {5.5 Zs}, respectively, of #Zs.

Rules about the manner in which the above-described {#Vc1, #Vc2, #Vol} are determined from the {#Va, #Zo, #Ip, #φa, #Zs} are described in terms of the following if . . . then construction (if A then B; if A holds, then B) within the rule base 29. It is to be noted that this if . . . then construction rule merely forms one example.

---

If Va is 0.5 kV and Zo is 7.5 Zo and Ip is Ip ● 1 and φa is μm and Zs is 5.0 Zs
  then Vcl is 355.0 and Vc2 is 50.5 and Vol is 1000.0
If Va is 0.5 kV and Zo is 6.0 Zo and Ip is Ip ● 5 and φa is μm and Zs is 5.0 Zs
  then Vcl is 200.0 and Vc2 is 130.0 and Vol is 800.0
. . .
. . .
. . .

---

The aforementioned fuzzy reasoning means 26 determines output variables {#Vc1, #Vc2, #Vol} from input variables {#Va, #Zo, #Ip, #φa, #Zs} by fuzzy reasoning by referring to the rules stored in the rule base 29. In the above example of if . . . then construction rule, the output variables of the THEN parts (right-hand side) are described in terms of numerical values. It is also possible to describe the output variables of the THEN parts in terms of fuzzy sets as follows:

---

If Va is 0.5 kV and Zo is 7.5 Zo and Ip is Ip ● 1 and φa is μm and Zs is 5.0 Zs
  then Vcl is F355.0 and Vc2 is F50.5 and Vol is F1000.0
If Va is 0.5 kV and Zo is 6.0 Zo and Ip is Ip ● 5 and φa is μm and Zs is 5.0 Zs
  then Vcl is F200.0 and Vc2 is F130.0 and Vol is F800.0
. . .
. . .
. . .

---

In the above examples, F355.0, F50.5, F1000.0, F200.0, F130.0, and F800. 0 indicate fuzzy sets. The case in which the output variables from the THEN parts are described in terms of numerical values differs in algorithm of fuzzy reasoning from the case in which output variables from the THEN parts are described in terms of fuzzy sets. The algorithm of the case in which the output variables from the THEN parts are described in terms of numerical values is first described.

FIGS. 7(a) and 7(b) show examples in which fuzzy reasoning is done with two inputs and one output. Two input variables are normalized accelerating voltage #Va and normalized probe current #Ip, respectively. One output variable is first condenser lens excitation-controlling amount #Vc1. It is assumed that #Va and #Ip are equal to v and p, respectively. As shown in FIG. 7(a), Vc1 which is described by the THEN part of the n-th rule given by "Vc1 is vc1n" (where vc1n is a numerical value). As shown in FIG. 7(b), Vc1 which is described by the THEN part of the m-th rule is given by "Vc1 is vc1m" (where vc1m is a numerical value). We now assume that the n-th rule is described as follows:

--- if Va is 2 kV and Ip is Ip ● 3
  then Vcl is vcln

---

In this case, the membership value indicating the degree to which the input v belongs to the fuzzy set {2 kV} is μ (2 kV|v). The membership value indicating the degree to which the input p belongs to the fuzzy set {Ip·3} is μ (Ip·3|p). The degree to which the IF part (left-hand side) of the n-th rule in FIG. 7(a) is valid is determined by min {μ (2 kV|v), μ (Ip·3|p)}. That is, the degree to which the IF part (left-hand side) of the n-th rule is valid is given by $$\mu n = min\{\mu(Vn|v), \mu(Ipn|p)\}$$

where Vn and Ipn are fuzzy sets of the accelerating voltage and probe current, respectively, described in the n-th rule. Similarly, where the number of input variables is 3 or more, the minimum one of membership values is selected. At this time, it is determined that the degree of correctness of vc1n described in the THEN part of the n-th rule is μn·vc1n. These operations are performed for every rule, rather than for only the n-th rule. An. estimated value §Vc1 which is an output is calculated according to the following equation:

$$\S Vcl = \sum_n (\mu n \cdot vcln) / \sum_n \mu n$$

The above-described operations for reasoning are similarly performed, using a summation Σ, where the number of output variables is 2 or more.

The case where the output variables from the THEN part are described in terms of fuzzy sets is now described by referring to FIGS. 8(a), 8(b) and 8(c) which show examples with 2 inputs and 1 output. The two inputs are normalized accelerating voltage value #Va and normalized probe current

Ip, respectively. The single output is the first condenser lens excitation-controlling amount #Vc1. It is assumed that #Va and #Ip are equal to v and p, respectively. If Vc1 described by the THEN part of the n-th rule is given by "VC1 is vc1n" (where vc1n is a fuzzy set) as shown in FIG. 8(a), and if Vc1 described by the THEN part of the m-th rule is given by "Vc1 is vc1m (where vc1m is a fuzzy set)" as shown in FIG. 8(b), it is assumed that the n-th rule, for example, is described as follows:

---
if VA is 2 kV and Ip is Ip ● 3
then Vc1 is vc1n
---

In this case, the membership value of the input v indicating the degree to which it belongs to the fuzzy set {2 kV} is μ (2 kV|v), and the membership value of the input p indicating the degree to which it belongs to the fuzzy set {Ip·3} is μ (Ip·3|p). The degree of validness μn of the IF part of the n-th rule shown in FIG. 8(a) is determined by min {μ (2 kV|v), μ (Ip·3 p)}. That is, the degree of validness μn of the IF part of the n-th rule is given by $$\mu n = min\{\mu(Vn|v), \mu(Ipn|p)\}$$

where Vn and Ipn are a fuzzy set of the accelerating voltage and a fuzzy set of the probe current, respectively, described in the n-th rule. Similarly, where the number of the input variables is 3 or more, one which gives the least membership value is selected. A membership function μ Bn which is used to evaluate fuzzy sets is created from the membership function μ (vc1n) and from μn indicating the degree of validness of the IF part of the n-th rule. The membership function μ (vc1n) expresses the fuzzy set vc1n described in the THEN part of the n-th rule. That is, the membership function is given by $$\mu\ Bn = min\{\mu n, \mu(vc1)\}$$

These operations are carried out for every rule rather than for only the n-th rule. Thus, as shown in FIG. 8(c), a new synthesized output function is created from the following formula:

$$\mu B^* = max\left\{ \bigcup_n \mu Bn \right\}$$

The center of gravity of μB* is calculated from this synthesized output function μB*, using the following formula.

$$\S Vc1 = \frac{\int_a^b v \cdot \mu B^* dv}{\int_a^b \mu B^* dv}$$

where a and b are boundary values of the output variable space. The calculated value is taken as an estimated value §Vc1 (see FIG. 8(c)) of the lens-controlling value of the first condenser lens. Where the number of the output variables is 2 or more, the above-described operations are also performed.

The fuzzy reasoning means 26 implements fuzzy reasoning and sends the first condenser lens excitation-controlling amount #Vc1, the second condenser lens excitation-controlling amount #Vc1, and the objective lens -excitation-controlling amount #Vo1 to the posttreatment means 28, which in turn denormalizes these amounts #Vc1, #Vc2, and #Vo1. For instance, the posttreatment means 28 multiplies them by parameters α, β, and γ, respectively, as given by $$Vc1=\alpha\#Vc1,\ Vc2=\beta Vc2,\ Vo1=\gamma\#Vo1$$

Thus, the denormalizations are performed. The rules stored in the rule base 29 can be modified and erased and new rules can be added by the rule editor 30.

As described thus far, in the present invention, rules for control of electron lenses are not arrays of numerical values but rather described in terms of if. . . then construction. Therefore, their physical meanings are easily understandable. Consequently, data can be handled easily. Where it is desired to add new rules about control or to erase the rules, it is only necessary to add or erase rules. In the prior art techniques, even the algorithms of numerical calculations must be modified. Furthermore, control points described in terms of rules are described by fuzzy sets and so fuzzy reasoning is carried out over the whole output variable space. Hence, the electron lenses can be controlled with a smaller number of rules; in the part, an exorbitant amount of data has been necessary for this purpose.

Figure 9:
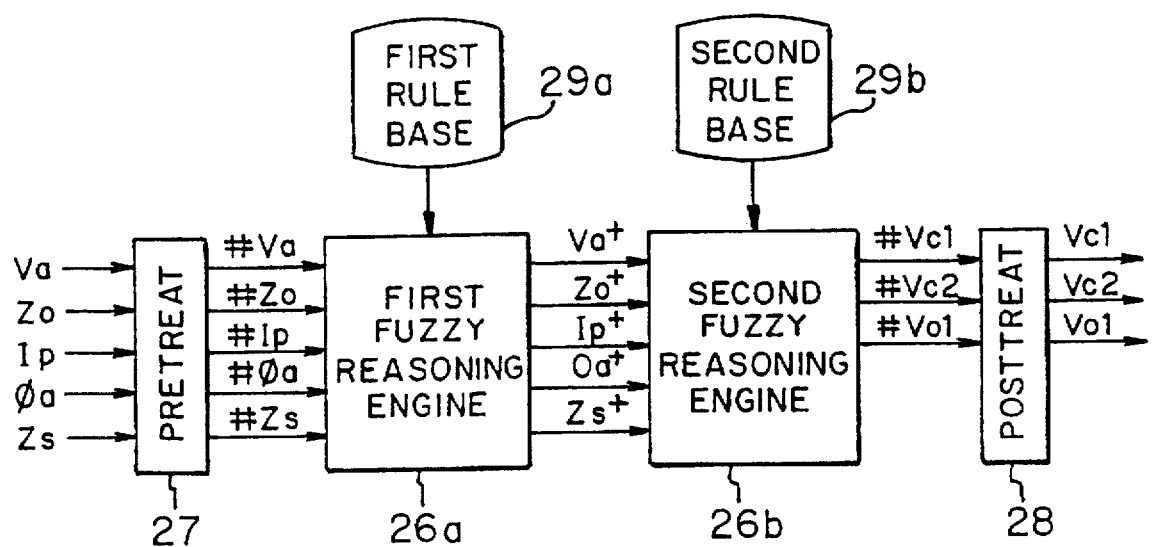
FIG. 9 is a diagram illustrating another method of transferring data into and out of the computer incorporated in the scanning electron microscope shown in FIG. 4.

Referring next to FIG. 9, there is shown another embodiment of the present invention. In this embodiment, fuzzy reasoning is implemented by a first fuzzy reasoning means 26a and a second fuzzy reasoning means 26b. The first fuzzy reasoning means 26a receives normalized variables {#Va, #Zo, #Ip, #φa, #Zs} from the pretreatment means 27. This first fuzzy reasoning means 26a corrects the variables by referring to the rules which are stored in a rule base 29a and described in terms of if . . . then construction. The rules in which corrected values of lens parameters are described in terms of if . . . then construction are stored in the rule base 29a. Accelerating voltage Va+, virtual electron source position Zo+, probe current Ip+, objective lens aperture diameter φa+, and specimen position Zs+modified in this manner are sent to the second fuzzy reasoning means 26b. The second fuzzy reasoning means 26b determines #Vc1, #Vc2, and #Vo1 from Va+, Zo+, Ip+, φa+, and Zs+by fuzzy reasoning by referring to the rules which are stored in the rule base 29b and described in terms of if . . . then construction. Such rules as being stored in the rule base 29 in FIGS. 4 and 5 are stored in the rule base 29b. That is to say, Rules about various lens parameter values and lens excitation-controlling values which are calculated based on electron optics are stored in the rule base 29b, the rules being described in terms of if . . . then construction.

Figure 10:
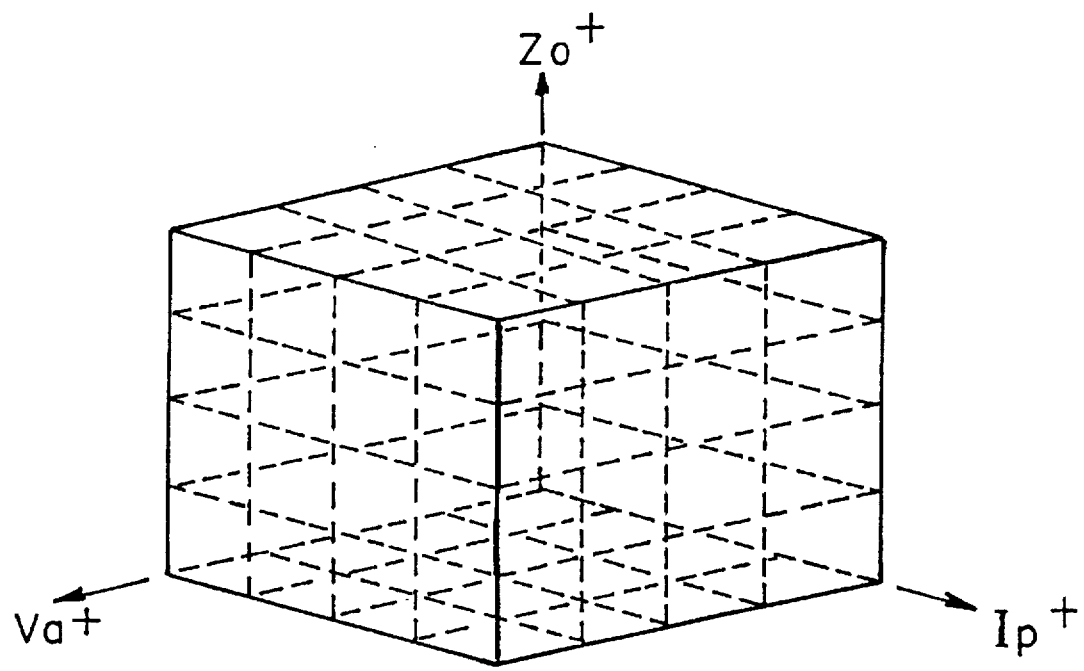
FIG. 10 is a diagram illustrating a three-dimensional parametric space described in terms of rules stored in the rule bases incorporated in the scanning electron microscope shown in FIG. 4.

For simplicity, it is assumed that the objective lens aperture diameter φa and specimen position Zs have been determined. It is also assumed that the second fuzzy reasoning means 26b performs fuzzy reasoning of three output variables {#Vc1, #Vc2, #Vo1} from three input variables {Va+, Zo+, Ip+}. FIG. 10 shows a three-dimensional parametric space described in terms of the rules stored in the rule base 29b. Variables, or parameters, are quantized, thus forming lattice points on a three-dimensional space. Three output variable values (#Vc1, #Vc2, #Vo1) obtained by calculations based on electron optics exist on these lattice points. Calculations indicate that these values existing at the lattice points are optimum values of the parameters. In practice, however, instrumental errors are introduced in the inputs Va, Zo, and Ip to the pretreatment means 27. Therefore, deviations from the calculated optimum values may occur. Accordingly, the first fuzzy reasoning means 26a corrects parameters at locations where deviations from the optimum values take place.

Rules about the manner in which the above-described {Va+, Zo+, Ip+} are determined from the {#Va, #Zo, #Ip} are described in terms of the following if . . . then construction within the rule base 29a. It is to be noted that this if . . . then construction rule merely forms one example.

```
If #Va is 0.5 kV and #Zo is 7.0 ZO and #Ip is Ip ● 3
then Va+ is 0.48 and Zo+ is 6.50 and Ip+ is 3.28
If #Va is 1.0 kV and #Zo is 6.5 Zo and #Ip is Ip ● 8
then Va+ is 0.98 and Zo+ is 6.45 and Ip+ is 8.42
...
...
```

In the above examples, 0.5 k V, 7.0 Zo, Ip-3, 1.0 kV, 6.5 Zo and Ip-8 indicate fuzzy sets.

The aforementioned first fuzzy reasoning means 26a determines output variables {Va+, Zo+, Ip+} from input variables {#Va, #Zo, #Ip} by fuzzy reasoning by referring to the rules stored in the rule base 29a. In the above example of if . . . then construction rule, the output variables of the THEN parts (right-hand side) are described in terms of numerical values. It is also possible to describe the output variables of the THEN parts in terms of fuzzy sets.

Figure 11:
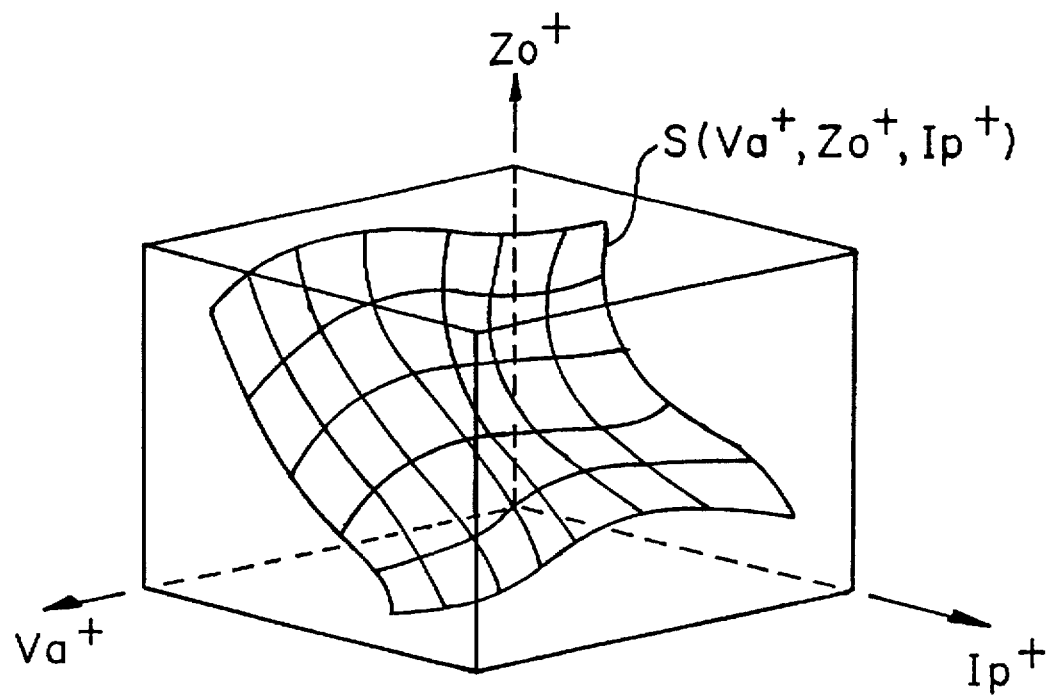
FIG. 11 is a diagram showing a three-dimensional parametric space corrected by a method according to the invention.

As a result, as shown in FIG. 11, a three-dimensional parametric space S(Va+, Zo+, Ip+) adapted for the actual instrument is obtained.

While the preferred embodiments of the present invention have been described in detail, it is to be understood that the invention is not limited thereto. In the above embodiments, the scanning electron microscope has been described by way of example. The application of the invention is not restricted to the scanning electron microscope. Rather, the invention is applicable to every instrument where a charged-particle beam is converged by a plurality of lenses, such as an electron probe microanalyzer, Auger electron spectrometer, and ion probe microanalyzer.

In the present invention, amounts providing control of the excitation of plural lenses are determined by fuzzy reasoning. Therefore, the excitation of the lenses can be controlled with a few number of rules and accurately and finely. Moreover, in the present invention, data is described in terms of if . . . then construction. This makes the physical meanings of the data more understandable. Besides, addition, erasure, and modification of data can be easily done. Further, the fuzzy reasoning enables multiple inputs and multiple outputs. As a result, if the rules are partially erased or modified or a new rule is added, fuzzy reasoning is done with all variables kept in association with each other.

What is claimed is:

1. A method of controlling excitation of a plurality of lenses incorporated in a charged-particle beam instrument producing a charged-particle beam, said method comprising the step of:

determining amounts providing control of the excitation of said lenses by fuzzy reasoning.

2. A charged-particle beam instrument having a charged-particle beam source for producing a charged particle beam, a plurality of lenses for focussing the beam, and means for controlling the excitation of the lenses, comprising:

computer memory means for storing a rule base for rules used to determine amounts providing control of excitation of said lenses, said rules defining the relation between various lens parameter values and various amounts providing control of the excitation of said lenses, said various lens parameter values and said various amounts being expressed in terms of if . . . then constructions; and computer means for implementing a fuzzy reasoning inference means for determining said amounts providing control of the excitation of said lenses by fuzzy reasoning from various lens parameter values by referring to said rules.

3. A charged-particle beam instrument having a charged-particle beam source for producing a charged particle beam, a plurality of lenses for focussing the beam, and means for controlling the excitation of the lenses, comprising:

computer memory means for storing a first rule base defining the relation between various lens parameter values and corrective values, said various lens parameter values and corrective values being described in terms of if . . . then constructions;

computer means for implementing a first fuzzy reasoning inference means for determining lens parameter corrective values by fuzzy reasoning from various lens parameter input values by referring to said first rule base;

computer memory means for storing a second rule base defining the relation between various lens parameter values and which are described in terms of if . . . then constructions; and computer means for implementing a second fuzzy reasoning inference means for determining amounts providing control of excitation of said lenses by fuzzy reasoning from corrected various lens parameter values by referring to said second rule base.

4. The charged-particle beam instrument of claim 2 or 3, further including a rule editor capable of modifying and erasing the rule or rules stored in said rule base or first and second rule bases and of adding new rules.

* * * * *

UNITED STATES PATENT AND TRADEMARK OFFICE
CERTIFICATE OF CORRECTION

PATENT NO. : 5,767,515
DATED : June 16, 1998
INVENTOR(S) : Kazuhiro Honda

It is certified that error appears in the above-identified patent and that said Letters Patent is hereby corrected as shown below:

Column 2 Line 38 "are adjusted" should read --is adjusted--.

Column 2 Lines 64-65 between "excitations" and "determined" insert --are--.

Column 4 Line 25 after "based" insert --on--.

Column 5 Line 35 "6(E)" should read --6(e)--.

Column 5 Line 41 "theTHEN" should read --the THEN--.

Column 7 Line 23 "is" should read --are--.

Column 7 Line 35 "{(Ip·2}" should read --{Ip·2)--.

Column 8 Line 13 "F800. 0" should read --F800.0--.

Column 8 Line 54 after "An" delete period --.--.

Column 9 Line 4 "VC1" should read --Vc1--.

Column 9 Line 7 after ""Vc1 is vclm" insert --"--.

Column 9 Line 7 after "fuzzy set" delete --"-- (close quote).

Column 9 Line 21 "Ip·3 p)}" should read --Ip·3|p)}--.

Column 9, formula between lines 50-55, "§Vcl" should read --§Vc1-- (should be number 1 rather than letter l).

Column 9 Line 66 "Vc1, and" should read --Vc2, and--.

Column 9 Line 66 "lens -excitation" should read --lens excitation--.

UNITED STATES PATENT AND TRADEMARK OFFICE
CERTIFICATE OF CORRECTION

PATENT NO. : 5,767,515
DATED : June 16, 1998
INVENTOR(S) : Kazuhiro Honda

It is certified that error appears in the above-identified patent and that said Letters Patent is hereby corrected as shown below:

Column 10 Line 6 "Vc2=$\beta$Vc2" should read --Vc2=$\beta$#Vc2--.

Column 10 Line 22 "in the part" should read --in the past--.

Column 10 Line 37 "Zs+modified" should read --Zs+ modified--.

Column 10 Line 40 "Zs+by" should read --Zs+ by--.

Column 10 Line 44 "say, Rules" should read --say, rules--.

Column 11 Line 7 "7.0 ZO" should read --7.0 Zo--.

Column 11 Line 14 "0.5k V" should read --0.5 kV--.

Signed and Sealed this

Twenty-fourth Day of November, 1998

*Attest:*

BRUCE LEHMAN

*Attesting Officer*   *Commissioner of Patents and Trademarks*